(12) United States Patent
Choi

(10) Patent No.: US 9,147,484 B2
(45) Date of Patent: Sep. 29, 2015

(54) SEMICONDUCTOR MEMORY DEVICE AND OPERATING METHOD THEREOF

(71) Applicant: SK hynix Inc., Gyeonggi-do (KR)

(72) Inventor: Sung Dae Choi, Chungcheongnam-do (KR)

(73) Assignee: SK Hynix Inc., Gyeonggi-do (KR)

( * ) Notice: Subject to any disclaimer, the term of this patent is extended or adjusted under 35 U.S.C. 154(b) by 43 days.

(21) Appl. No.: 14/200,454

(22) Filed: Mar. 7, 2014

(65) Prior Publication Data

US 2015/0085584 A1    Mar. 26, 2015

(51) Int. Cl.
*G11C 16/26* (2006.01)
*G11C 16/30* (2006.01)

(52) U.S. Cl.
CPC ............... *G11C 16/26* (2013.01); *G11C 16/30* (2013.01)

(58) Field of Classification Search
CPC ..... G11C 16/26; G11C 16/30; G11C 16/0483
USPC ............................ 365/185.21, 185.17, 185.18
See application file for complete search history.

(56) References Cited

U.S. PATENT DOCUMENTS

| | | | | |
|---|---|---|---|---|
| 6,819,592 B2* | 11/2004 | Noguchi et al. | .......... | 365/185.17 |
| 7,924,632 B2* | 4/2011 | Sato | .......... | 365/189.06 |
| 8,811,087 B2* | 8/2014 | Yun et al. | .......... | 365/185.18 |
| 8,873,292 B2* | 10/2014 | Nawata et al. | .......... | 365/185.17 |
| 8,913,433 B2* | 12/2014 | Kim et al. | .......... | 365/185.17 |
| 2005/0254302 A1* | 11/2005 | Noguchi | .......... | 365/185.17 |

FOREIGN PATENT DOCUMENTS

KR    1020090069888    7/2009

* cited by examiner

*Primary Examiner* — Tan T. Nguyen
(74) *Attorney, Agent, or Firm* — IP & T Group LLP

(57) ABSTRACT

A semiconductor memory device and an operating method thereof are provided. The semiconductor memory device includes a memory cell array including a plurality of memory groups each including at least a drain-select transistor and a plurality of memory cells, a voltage generator suitable for generating a read voltage that is to be applied to a selected memory cell of the memory cells and a pass voltage that is to be applied to unselected memory cells other than the selected memory cell among the memory cells, and a control logic suitable for controlling the voltage generator to generate the pass voltage to have different levels depending on a distance between the drain-select transistor and the selected memory cell during a read operation.

14 Claims, 8 Drawing Sheets

SEMICONDUCTOR MEMORY DEVICE AND OPERATING METHOD THEREOF

CROSS-REFERENCE TO RELATED APPLICATION

The present application claims priority to Korean patent application number 10-2013-0114775 filed on Sep. 26, 2013, in the Korean Intellectual Property Office, the entire disclosure of which is incorporated by reference herein.

BACKGROUND

1. Technical Field

Various embodiments of the present invention relate to a semiconductor memory device and an operating method thereof.

2. Related Art

A semiconductor memory device is implemented using a semiconductor, such as silicon (Si) germanium (Ge), gallium arsenide (GaAs), indium phosphide (InP), etc. The semiconductor memory device is mainly classified into a volatile memory and a nonvolatile memory.

The volatile memory is a memory device, which loses stored data when power is interrupted. Examples of the volatile memory include a static random access memory (SRAM), a dynamic RAM (DRAM), a synchronous DRAM (SDRAM), etc. The nonvolatile memory is a memory device, which maintains stored data even when power is interrupted. Examples of the nonvolatile memory include a read only memory (ROM), a programmable ROM (PROM), an erasable programmable ROM (EPROM), an electrically erasable programmable ROM (EEPROM), a flash memory, a phase-change RAM (PRAM), a magnetic RAM (MRAM), a resistive RAM (RRAM), a ferroelectric RAM (FRAM), etc. The flash memory is mainly divided into a NOR type flash memory and a NAND type flash memory.

Such a semiconductor memory device has been reduced in size, and the size of components inside the semiconductor memory device has also been reduced. For example, the size of a memory cell in the semiconductor memory device is reduced and a width of a bit line connected to the memory cell is also reduced. Accordingly, environments of inducing cell currents $I_{cell}$ in a programming operation process and a read operation process are changed. When a read operation of the semiconductor memory device is performed, a value of the cell current is incorrectly read. For example, the value of the cell current may be read to be greater than it is, which is referred to as a Back Pattern Dependency phenomenon. This may degrade the operation reliability.

BRIEF SUMMARY

Various embodiments of the present invention are directed to a semiconductor memory device that is capable of improving reliability, and an operating method thereof.

One aspect of the present invention provides a semiconductor memory device including a memory cell array including a plurality of memory groups each including at least a drain-select transistor and a plurality of memory cells, a voltage generator suitable for generating a read voltage that is to be applied to a selected memory cell of the memory cells and a pass voltage that is to be applied to unselected memory cells other than the selected memory cell among the memory cells, and a control logic suitable for controlling the voltage generator to generate the pass voltage to have different levels depending on a distance between the drain-select transistor and the selected memory cell during a read operation.

Another aspect of the present invention provides a method of operating a semiconductor memory device including a plurality of memory groups each including at least a drain-select transistor and a plurality of memory cells. The method may include, during a read operation, generating a pass voltage having different levels depending on a distance between the drain-select transistor and a selected memory cell of the memory cells, and applying the pass voltage to unselected memory cells other than the selected memory cell among the memory cells.

Still another aspect of the present invention provides a memory system including a semiconductor memory device, and a controller suitable for controlling the semiconductor memory device, wherein the semiconductor memory device may include a memory cell array including a plurality of memory groups each including at least a drain-select transistor and a plurality of memory cells, a voltage generator suitable for generating a read voltage that is to be applied to a selected memory cell of the memory cells and a pass voltage that is to be applied to unselected memory cells other than the selected memory cell among the memory cells, and a control logic suitable for controlling the voltage generator to generate the pass voltage to have different levels depending on a distance between the drain-select transistor and the selected memory cell during a read operation.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION

Figure 1:
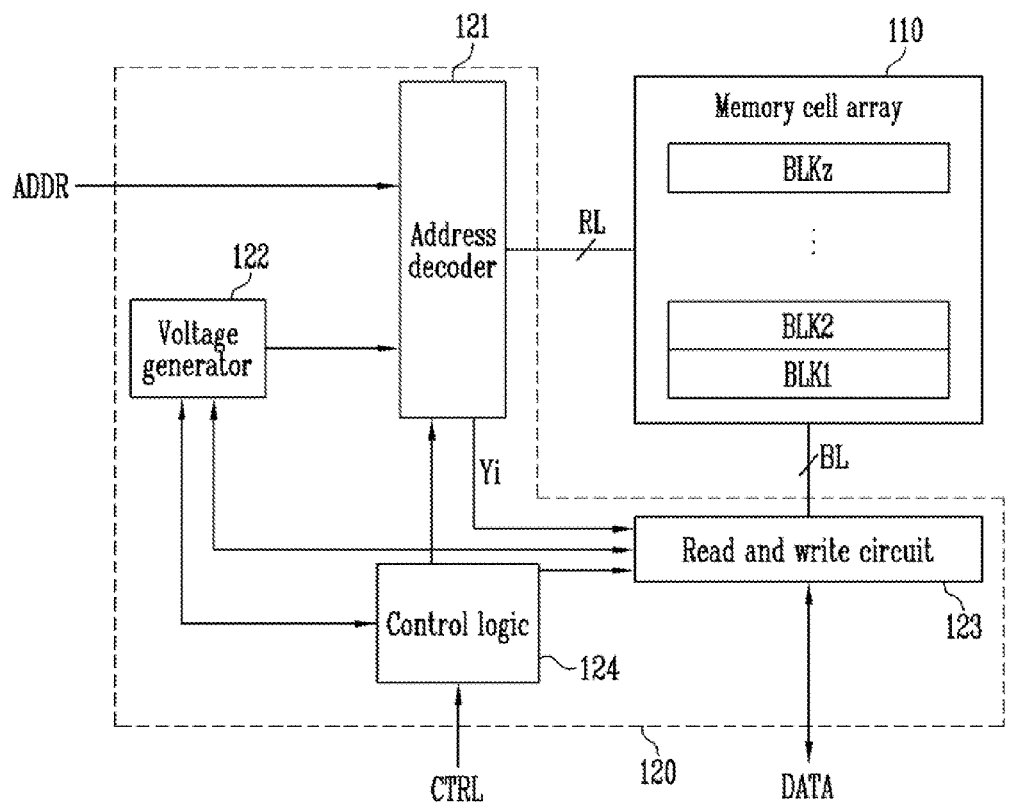
FIG. 1 is a block diagram illustrating a semiconductor memory device according to an exemplary embodiment of the present invention.

The present invention will be described more fully hereinafter with reference to the accompanying drawings, in which exemplary embodiments of the invention are shown. This invention may, however, be embodied in different forms and should not be construed as limited to the embodiments set forth herein. Throughout the disclosure, reference numerals correspond directly to the like numbered parts in the various figures and exemplary embodiments of the present invention.

In the description of the present invention, it will be understood that, when a part is referred to as being "connected" to another part, it can be "directly connected" to the other part or "indirectly connected" to the other part while intervening one or more elements therebetween. In the description of the present invention, it will be understood that, when a part includes/comprises an element, another element is not excluded but further included as long as an opposite statement is not made.

FIG. 1 is a block diagram illustrating a semiconductor memory device according to an exemplary embodiment of the present invention.

Referring to FIG. 1, a semiconductor memory device 100 includes a memory cell array 110 and a periphery circuit 120 to drive the memory cell array 110.

The memory cell array 110 includes a plurality of memory blocks BLK1 to BLKz. The plurality of memory blocks BLK1 to BLKz are connected to an address decoder 121 through roar lines RL. The plurality of memory blocks BLK1 to BLKz are connected to a read and write circuit 123 through bit lines BL. Each of the plurality of memory blocks BLK1 to BLKz includes a plurality of cell strings, and each of the plurality of cell strings includes a plurality of memory cells. According to an example, the plurality of memory cells may be nonvolatile memory cells. According to another example, each of the plurality of memory cells may be defined as a single level cell or a multi-level cell. The memory cell array according to an exemplary embodiment of the present invention may include a plurality of memory cells arranged at intersections between word lines and bit lines. The plurality of memory cells may be divided into memory cell groups each having adjacent memory cells.

The periphery circuit 120 may drive the memory cell array 110. The periphery circuit 120 includes the address decoder 121, a voltage generator 122, the read and write circuit 123, and a control logic 124.

The address decoder 121 is connected to the memory cell array 110 through the row lines RL. The row lines RL may include a drain-select line, a word line, a source-select line, and a common source line. The address decoder 121 may drive the row lines RL in response to the control of the control logic 124. The address decoder 121 receives an address ADDR from an input/output buffer (not shown) in the semiconductor memory device 100 or from the outside.

The address decoder 121 may decode a block address from the received addresses ADDR. The address decoder 121 selects at least one memory block based on the decoded block address.

The address decoder 121 may decode a row address from the received addresses ADDR. Based on the decoded row address, voltages provided from the voltage generator 122 are applied to row lines RL.

The address decoder 121 is configured to decode a column address from the received addresses ADDR. The address decoder 121 transmits a decoded column address Yi to the read and write circuit 123.

A programming operation of the semiconductor memory device 100 is performed in units of pages. Upon request for programming, the address ADDR may include a block address, a row address, and a column address. The address decoder 121 may select a single memory block, and a single dram-select line and a single word line thereof in response to the address ADDR, and it may provide a decoded column address Yi to the read and write circuit 123.

The address decoder 121 may include a block decoder, a row decoder, a column decoder, and an address buffer.

The voltage generator 122 may generate a plurality of voltages by use of external voltages supplied to the semiconductor memory devices 100. The voltage generator 122 operates in response to the control of the control logic 124. The voltages generated from the voltage generator 122 may be used as driving voltages for the address decoder 121, the read and write circuit 123, and the control logic 124. According to an example, the voltage generator 122 may include a circuit configured to generate a power supply voltage by regulating an external voltage. The voltage generator 122 may include a plurality of pumping capacitors, and by selectively activating the plurality of pumping capacitors, may generate a plurality of voltages. In addition, the voltage generator 122 may be configured to generate a read voltage that is to be applied to a selected memory cell and a plurality of pass voltages that are to be applied to unselected memory cells. The voltage generator 122 may generate pass voltages corresponding in number to main memory cells connected to a single bit line. Further, the voltage generator 122 may generate pass voltages corresponding in number to memory cell groups.

During a programming operation and a read operation, the read and write circuit 123 exchanges data DATA with the input/output buffer (not shown) provided in the semiconductor memory device 100 or with the outside. During a programming operation, the read and write circuit 123 receives data DATA that is to be subject to a programming operation. The read and write circuit 123 transmits the received data DATA to bit lines indicated by a decoded column address Yi among bit lines BL. The transmitted data DATA is programmed to selected memory cells. During a read operation, the read and write circuit 123 reads data from memory cells selected through the bit lines indicated by the decoded column address Yi among the bit lines BL, and outputs the read data DATA.

According to an example, the read and write circuit 123 may include page buffers (or page registers) and a column select circuit.

The control logic 124 is connected to the address decoder 121, the voltage generator 122, and the read and write circuit 123. The control logic 124 receives a control signal CTRL from the input/output buffer (not shown) of the semiconductor memory device 100 or from the outside. The control logic 124 may control overall operations of the semiconductor memory device 100 in response to the control signal CTRL.

The control logic 124 according to an exemplary embodiment of the present invention may control, during a read operation, so that the voltage generator generates pass voltages having different levels depending on a distance between a drain-select transistor and a selected memory cell, and the generated pass voltages are applied to unselected memory cells. For example, the control logic 124 may control, during a read operation, the voltage generator 122 to generate a higher pass voltage as the distance between the drain-select transistor and the selected memory cell becomes larger. In addition, during a read operation, the control logic 124 may control the voltage generator 122 to generate pass voltages having different levels depending on the distance between the drain-select transistor and a memory cell group including the selected memory cell. For example, the control logic 124 may control the voltage generator 122 to generate a higher pass voltage as the distance between the drain-select transistor and the memory cell group including the selected memory cell becomes larger.

The semiconductor memory device 100 may further include the input/output buffer (not shown). The input/output buffer receives a control signal CTRL and an address ADDR from the outside, and transmits the received control signal CTRL and address ADDR to the control logic 124 and the address decoder 121, respectively. In addition, the input/output buffer may transmit data DATA from the outside to the read and write circuit 123, and transmit data DATA from the read and write circuit 123 to the outside.

Such an operation of the periphery circuit 120 is performed by use of the address decoder 121, the voltage generator 122, the read and write circuit 123, and the control logic 124 that are included in the periphery circuit 120.

Hereinafter, the operation of the semiconductor memory device described above will be described in detail.

Figure 2:
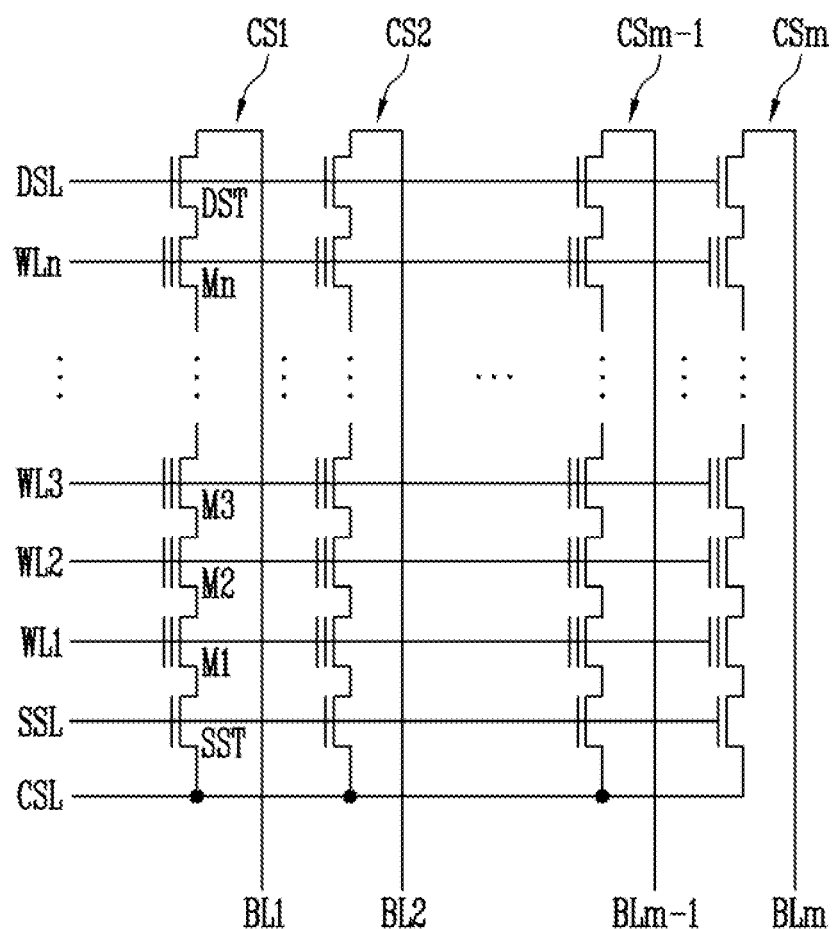
FIG. 2 is a block diagram illustrating one of a plurality of memory blocks of FIG. 1.

FIG. 2 is a block diagram illustrating one of a plurality of memory blocks of FIG. 1.

Referring to FIG. 2, the memory block BLK1 includes a plurality of cell strings CS1 to CSm. The plurality of cell strings CS1 to CSm are connected to first to $m^{th}$ bit lines BL1 to BLm (see BL in FIG. 1), respectively.

Each of the plurality of cell strings CS1 to CSm may include a source-select transistor SST, a plurality of memory cells M1 to Mn connected in series, and a drain-select transistor DST. The source-select transistor SST is connected to a source-select line SSL. The first to $n^{th}$ memory cell M1 to Mn are connected to first to $n^{th}$ word lines WL1 to WLn, respectively. The drain-select transistor DST is connected to a drain-select line DSL. A common source line CSL is connected at a source side of the source-select transistor SST. The bit lines BL1 to BLm are connected to drain sides of the respective drain-select transistors DST, respectively. The source-select line SSL, the first to $n^{th}$ word lines WL1 to WLn, and the drain-select line DSL are included in the row lines RL described with reference to FIG. 1. The source-select line SSL, the first to $n^{th}$ word lines WL1 to WLn, and the drain-select line DSL are driven by the address decoder 121.

The memory block BLK1 shown in FIG. 2 is illustrated as an example, and it is obvious to those skilled in the art that various changes of the memory block BLK1 may be made depending on a structure of the memory cell array without departing the scope of the disclosure.

Figure 3:
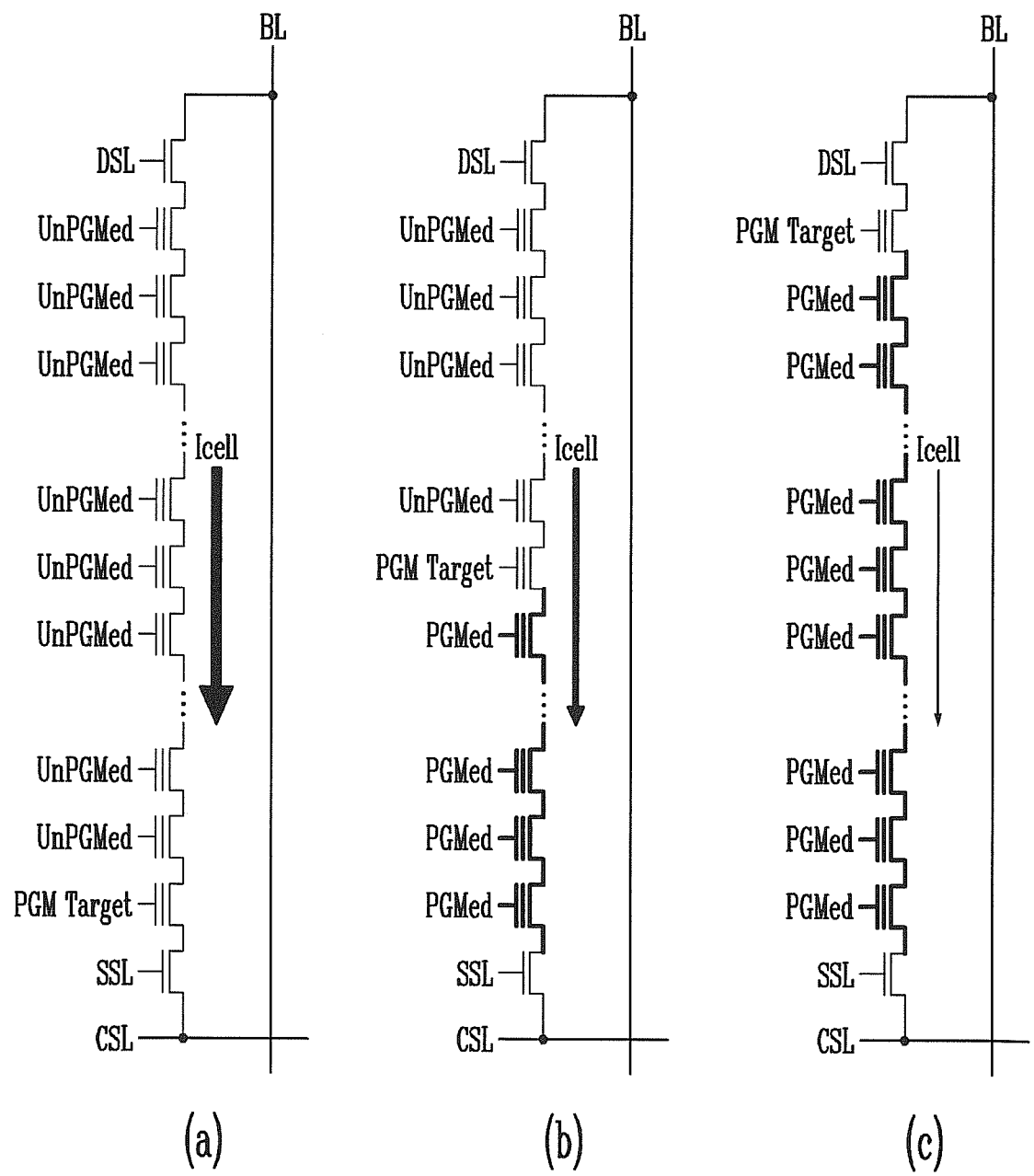
FIG. 3 is a view illustrating magnitude of a cell current ($I_{cell}$) depending on the position of a memory cell during a programming operation according to an exemplary embodiment, of the present invention.

FIG. 3 is a view illustrating magnitude of a cell current ($I_{cell}$) depending on the position of a memory cell during a programming operation according to an exemplary embodiment of the present invention.

Referring to FIG. 3, a programming operation of the semiconductor memory device through bit lines BL is shown. That is, FIG. 3 shows that the cell current decreases as each memory cell is programmed.

First, an illustration (a) of FIG. 3 represents an initial stage of programming. That is, in the initial stage of programming, most of the memory cells remain unprogrammed. A memory cell in an unprogrammed state has an on-resistance smaller than that of a memory cell in a programmed state, and thus a relatively larger current flows through the bit line BL as a cell current $I_{cell}$.

An illustration (b) of FIG. 3 represents an intermediate stage of programming. As the programming proceeds, programmed memory cells increase. The programmed memory cells have on-resistances higher than those of unprogrammed memory cells, so that the cell current $I_{cell}$ decreases.

An illustration (c) of FIG. 3 represents a final stage of programming. In the case of the illustration (c) of FIG. 3, as most of the memory cells are programmed, on-resistances of the memory cells increase, so that the cell current $I_{cell}$ further decreases.

As described above, the magnitude of the cell current changed depending on the progress of the programming stage.

Although the programming process is illustrated as starting from a memory cell located at the source-select transistor SST, the present invention is not limited thereto. The present invention may be implemented regardless of the sequence of programming memory cells.

Figure 4:
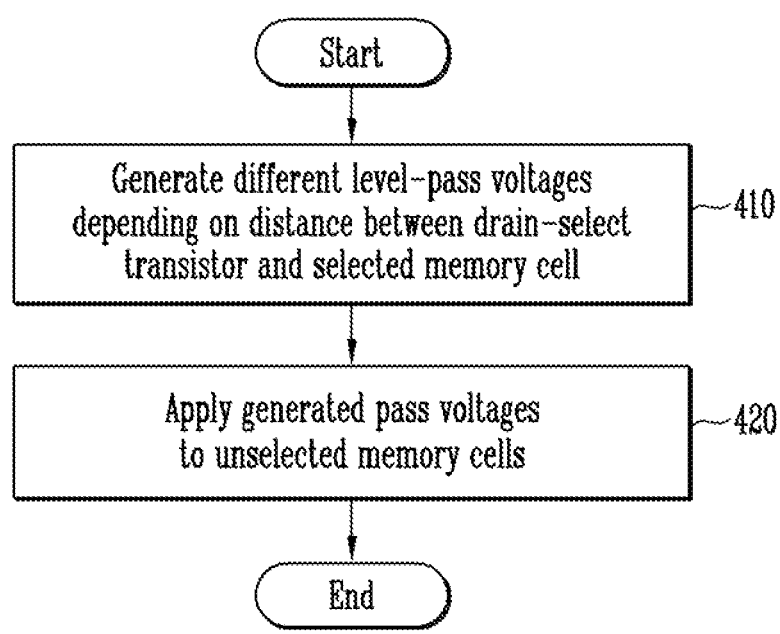
FIG. 4 is a flowchart showing a method of operating a semiconductor memory device according to an exemplary embodiment of the present invention.

FIG. 4 is a flowchart showing a method of operating a semiconductor memory device according to an exemplary embodiment of the present invention.

First, the semiconductor memory device, during a read operation, may generate pass voltages having different levels depending on the distance between a drain-select transistor and a selected memory cell (410). A higher pass voltage is generated as the distance between the drain-select transistor and the selected memory cell becomes larger. Such a configuration may prevent the degradation of reliability due to the back pattern dependency phenomenon that is described above, and as such, read voltages at different levels are applied depending on the positions of the memory cells during a read operation. Such a configuration will be described with reference to FIG. 5.

Figure 5:
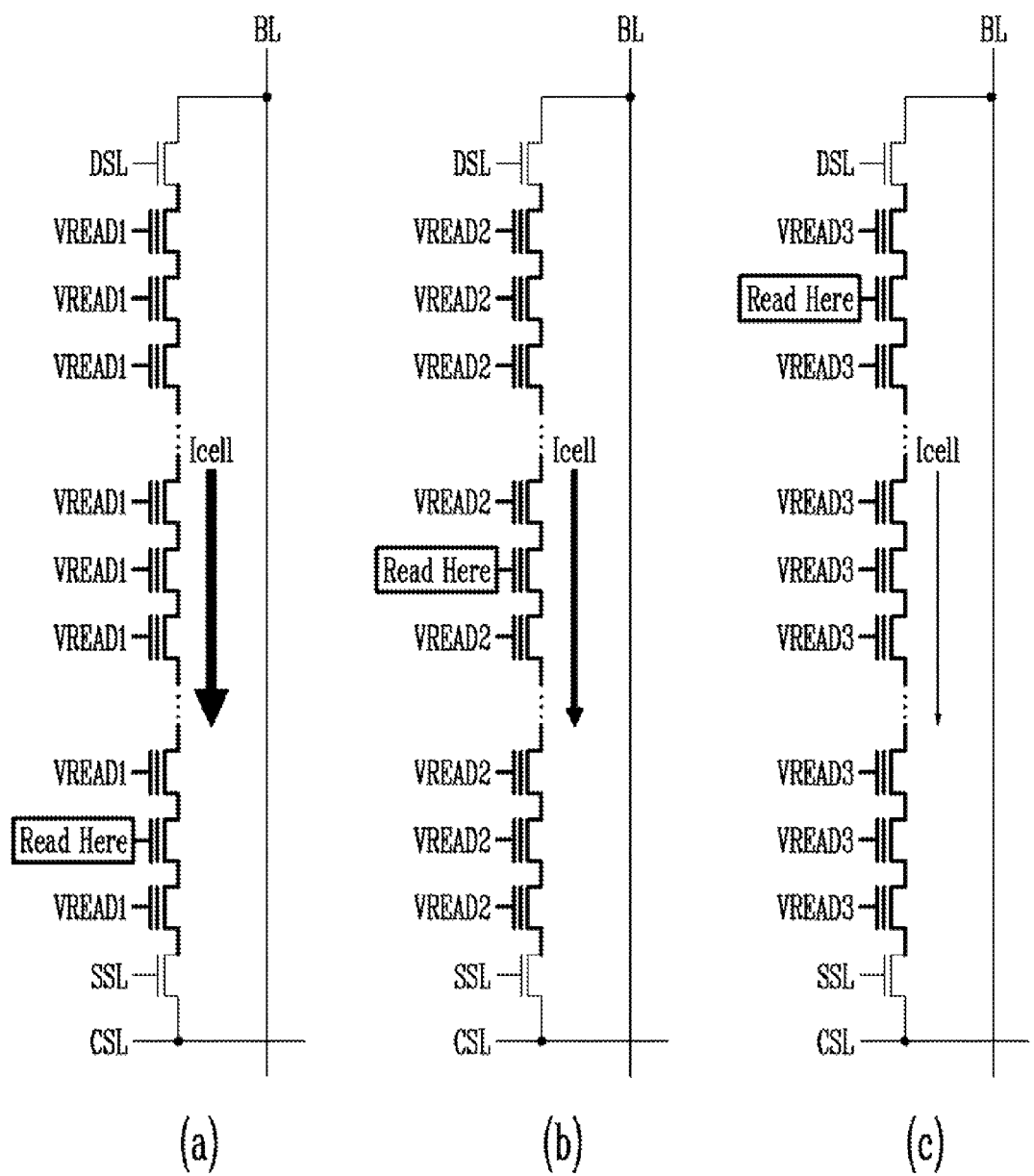
FIG. 5 is a view illustrating magnitude of a cell current ($I_{cell}$) depending on the position of a memory cell during a read operation according to an exemplary embodiment of the present invention.

FIG. 5 is a view illustrating magnitude of a cell current ($I_{cell}$) depending on the position of a memory cell during a read operation according to an exemplary embodiment of the present invention.

An illustration (a) of FIG. 5 represents a read operation with respect to a memory cell that is distant from the drain-select transistor. Cells that are not selected during the read operation are supplied with a pass voltage VREAD1 having a high voltage level.

An illustration (b) of FIG. 5 represents a read operation with respect to a memory cell that is at the average distance from the drain-select transistor. Cells that are not selected during the read operation are supplied with a pass voltage VREAD2 having an average voltage level.

An illustration (c) of FIG. 5 represents a read operation with respect to a memory cell that is adjacent to the drain-select transistor. Cells that are not selected during the read operation are supplied with a pass voltages VREAD3 having a low voltage level.

In the above description, being distant/adjacent in the position and being high/low in the voltage level represent a relative value, and it is understood that as the distance between the memory cell and the drain-select transistor becomes larger, a relatively high voltage level is applied, and as the distance between the memory cell and the drain-select transistor becomes smaller, a relatively low voltage level is applied (VREAD1>VREAD2>VREAD3).

Such an operation according to an exemplary embodiment of the present invention prevents reliability degradation due to the back pattern dependency phenomenon.

That is in general, a read operation is performed in a state that most of the memory cells are programmed, and thus each memory cell has the same surrounding environment as the illustration (c) in FIG. 3. In this case, when a memory cell adjacent to the drain-select transistor is subject to a read operation even at the same cell current as the cell current $I_{cell}$ of the illustration (c) in FIG. 3, an error does not occur. However, when a memory cell distant from the drain-select transistor is subject to a read operation in which case most of the cells are already programmed, on-resistance of each cell becomes larger, and thus a smaller cell current $I_{cell}$ flows and may produce the back pattern dependency phenomenon.

According to an exemplary embodiment of the present invention, when memory cells distant from the drain-select transistor are read, a relatively higher read voltage is applied to compensate for on-resistance of each memory cell, thereby forming an environment that is same as or similar to an environment when a programming is performed. In this manner, the illustration (a) in FIG. 5 has the same operating environment for a read operation as that of the illustration (a) in FIG. 3, and the illustrations (b) and (c) in FIG. 5 have the same operating environments for a read operation as those of the illustrations (b) and (c) in FIG. 3.

Although, in FIG. 5, the voltage to be applied depending on the position of a memory cell is divided into three types of voltages, memory cells may be divided into groups in various manners depending on an implementation method, or the voltage may be divided as many as the number of main memory cells in the bit line BL and applied.

The memory cells in the bit line BL may be divided into memory cell groups each having adjacent memory cells, and the semiconductor memory device may control such that a pass voltage having a different level depending on the distance between the drain-select transistor and a memory cell group including a selected memory cell. That is, a higher pass voltage may be generated as the distance between the drain-select transistor and the memory cell group including the selected memory cell becomes larger.

Accordingly, the semiconductor memory device may generate pass voltages as many as the number of the memory cell groups.

Thereafter, the semiconductor memory device may apply the generated pass voltages to unselected memory cells (420).

Figure 6:
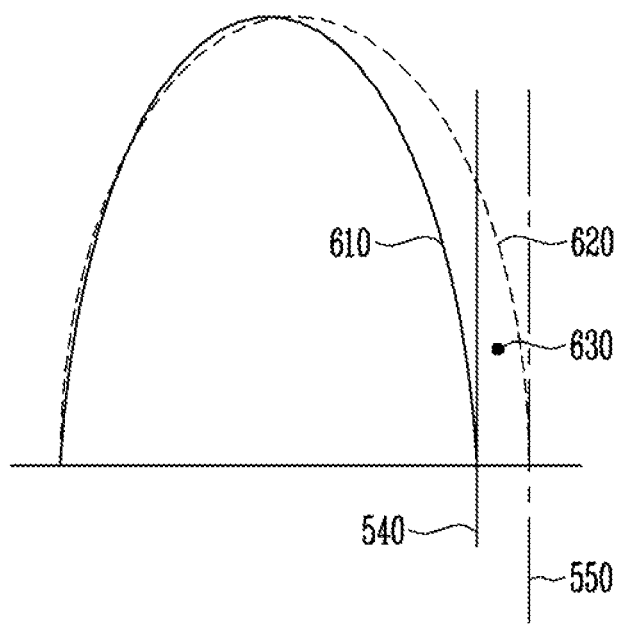
FIG. 6 is a view illustrating distribution of actual threshold voltages of programmed memory cells and distribution of threshold voltages sensed during a read operation.

FIG. 6 is a view illustrating distribution of actual threshold voltages of programmed memory cells and distribution of threshold voltages sensed during a read operation.

In FIG. 6, a solid line 610 represents distribution of actual threshold voltages of programmed memory cells, and a dotted line 620 represents distribution of threshold voltages of the memory cells sensed during a read operation. Most memory cells may have a threshold voltage distribution corresponding to a region 630 between the solid line 610 and the dotted line 620.

In this case, an ideal read voltage level is to be level 540, but due to the back pattern dependency phenomenon, the threshold voltage distribution is widen to the right side. Accordingly, a higher read voltage level 550 is to be applied to a memory cell distant from the drain-select transistor so that the same value as the actual programmed threshold voltage distribution is sensed.

Figure 7:
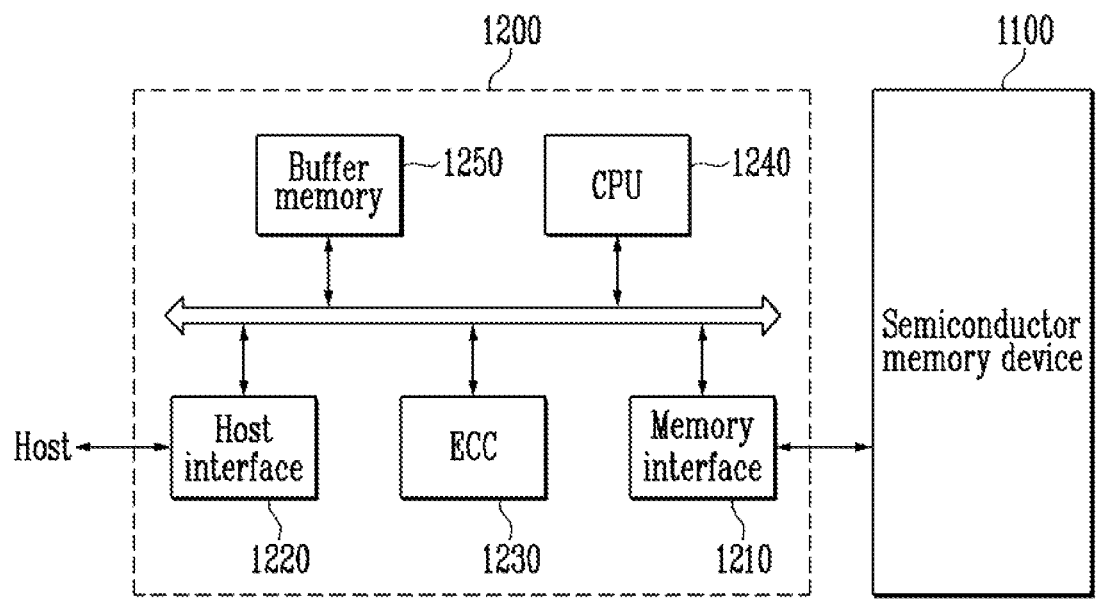
FIG. 7 is a block diagram illustrating a memory system including a semiconductor memory device according to an exemplary embodiment of the present invention.

FIG. 7 is a block diagram illustrating a memory system including a semiconductor memory device according to an exemplary embodiment of the present invention. Referring to FIG. 7, the memory system 1000 includes the semiconductor memory device 1100 and a controller 1200.

The semiconductor memory device 1100 is formed and operates in the same manner as the semiconductor memory device 100 described above with reference to FIG. 1. Herein, detailed description identical to that of the semiconductor memory device 100 will be omitted.

A controller 1200 is connected to a host and the semiconductor memory device 1100. The controller 1200 may access the semiconductor memory device 1100 in response to a request by the host. For example, the controller 1200 may control a read operation, a write operation, an erase operation, and a background operation of the semiconductor memory device 1100. The controller 1200 may provide an interface between the semiconductor memory device 1100 and the host. The controller 1200 may drive firmware for controlling the semiconductor memory device 1100.

The controller 1200 includes a memory interface 1210, a host interface 1220, an error checking and correcting circuit, i.e., an error correcting code (ECC) circuit 1230, a central processing unit (CPU) 1240, and a buffer memory 1250.

The memory interface 1210 transmits data from the buffer memory 1250 to the semiconductor memory device 1100. The memory interface 1210 transmits data read from the semiconductor memory device 1100 to the buffer memory 1250. Here, the memory interface 1210 may use an interface method of NAND flash memory. The controller 1200 may perform a programming operation, a read operation, and an erase operation in the NAND flash memory interface method.

The host interface 1220 includes a protocol for performing data exchange between the hose and the controller 1200. For example, the host interface 1220 is configured to communicate with the host through at least one of a universal serial bus (USB) protocol, a multimedia card (MMC) protocol, a peripheral component interconnection (PCI) protocol, a PCP-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The ECC circuit 1230 generates parity bits by use of data transmitted to the semiconductor memory device 1100. The parity bits generated as such are stored in semiconductor memory chips of the semiconductor memory device 1100. The ECC circuit 1230 detects errors of data read from the semiconductor memory device 1100 by use of the parity bits. If the detected errors lay within a correctable range, the ECC circuit 1230 corrects the detected errors.

The CPU 1240 analyzes and processes signals inputted from the host. The CPU 1240 controls the host or the semiconductor memory device 1100 through the host interface 1220 or the memory interface 1210.

The CPU 1240 may control the semiconductor memory device 1100 based on firmware for controlling the semiconductor memory device 1100.

The buffer memory 1250 temporarily stores program data provided from the host or data read from the semiconductor memory device 1100. In addition, the buffer memory 1250 may temporarily store metadata or cache data that are to be stored in the semiconductor memory device 1100. Upon sudden power off, the metadata or cache data stored in the buffer memory 1250 are stored in the semiconductor memory device 1100. The buffer memory 1250 may include a dynamic random-access memory (DRAM) and a static random-access memory (SRAM).

The semiconductor memory device 1100 and the controller 1200 may be integrated into a single semiconductor device. For example, the semiconductor memory device 1100 and the controller 1200 may be integrated into a single semiconductor device to form a memory card, such as a personal computer memory card international association (PCMCIA) card, a compact flash card (CF), a smart media card (SM, SMC), a memory stick, a multimedia card (MMC, RS-MMC, MMC-micro), a secure digital card (SD, miniSD, microSD), and an universal flash storage device (UFS).

The semiconductor memory device 1100 and the controller 1200 may be integrated into a single semiconductor device to form a semiconductor drive, that is, a solid state drive (SSD). The semiconductor drive SSD includes a storage device configured to store data in a semiconductor memory. In a memory system 1000 used as the semiconductor drive (SDD), the operating speed of the host connected to the memory system 1000 may be remarkably improved.

According to another example, the memory system 1000 may be provided as one of various components of electronic devices, such as a computer, a ultra mobile PC (UMPC), a workstation, a netbook, a personal digital assistants (PDA), a portable computer, a web tablet, a wireless phone, a mobile phone, a smartphone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices forming a home network, one of various electronic devices forming a computer network, one of various electronic devices forming a telematics network, an RFID device, and one of various parts forming a computing system.

According to an exemplary embodiment of the present invention, the semiconductor memory device 1100 or the memory system 1000 may be mounted in various forms of packages. For example, the semiconductor memory device 1100 or the memory system 1000 may be packaged and mounted in various forms, such as package on package (PoP), ball grid array (BGA), chip scale package (CSP), plastic leaded chip carrier (PLCC), plastic dual in line package (PDIP), die in waffle pack, die in wafer form, chip on board (COB), ceramic dual in line package (CERDIP), plastic metric quad flat package (MQFP), thin quad flat package (TQFP), small outline package (SO), shrink small outline package (SSOP), thin small outline package (TSOP), system in package (SIP), multi chip package (MCP), wafer-level fabricated package (WFP), and wafer-level processed stack package (WSP).

Figure 8:
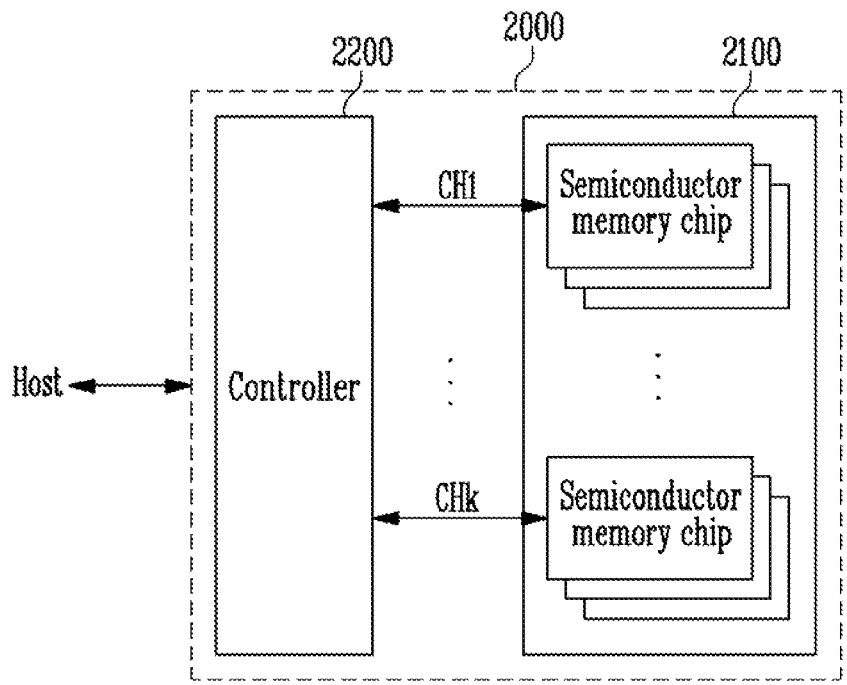
FIG. 8 is a block diagram illustrating an example of application of the memory system of FIG. 7.

FIG. 8 is a block diagram illustrating an example 2000 of application of the memory system 1000 of FIG. 7.

Referring to FIG. 8, the memory system 2000 includes a semiconductor memory device 2100 and a controller 2200. The semiconductor memory device 2100 includes a plurality of semiconductor memory chips. Each of the semiconductor memory chips may be configured and operate in the same manner as the semiconductor memory device 100 described above with reference to FIG. 1.

The plurality of semiconductor chips are divided into a plurality of groups. On FIG. 8, the plurality of groups are illustrated as communicating with the controller 2200 through a first channel to a $k^{th}$ channel CH1 to CHK, respectively.

Each group is configured to communicate with the controller 2200 through a single common channel. The controller 2200 may be configured in the same manner as the controller 1200 described above with reference to FIG. 7, and it controls the plurality of memory chips of the semiconductor memory device 2100 through the plurality of channels CH1 to CHK.

Although, in FIG. 8, a plurality of semiconductor memory chips are illustrated as being connected to a single channel, the present invention is not limited thereto. For example, modification of the memory system 2000 may be made so that a single semiconductor memory chip may be connected to a single channel.

Figure 9:
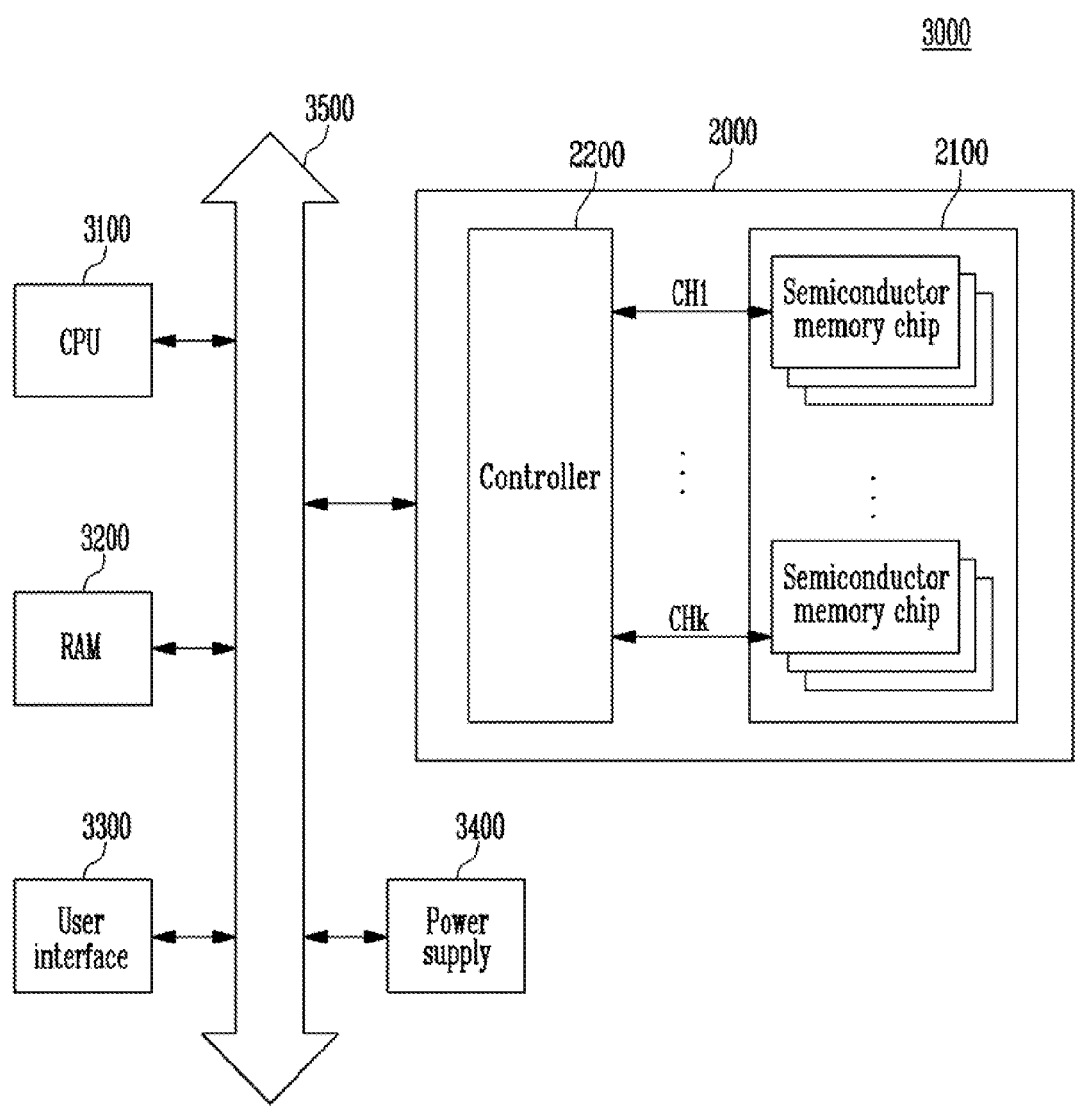
FIG. 9 is a block diagram illustrating a computing system including the memory system described with reference to FIG. 8.

FIG. 9 is a block diagram illustrating a computing system 3000 including the memory system 2000 illustrated with reference to FIG. 8.

Referring to FIG. 9, the computing system 3000 includes a central processing unit (CPU) 3100, a random access memory (RAM) 3200, a user interface 3300, a power supply 3400, a system bus 3500, and the memory system 2000.

The memory system 2000 is electrically connected to the central processing unit 3100, the RAM 3200, the user interface 3300, and the power supply 3400 through the system bus 3500. Data provided through the user interface 3300 or processed by the CPU 3100 are stored in the memory system 2000.

Although the semiconductor memory device 2100 in FIG. 9 is illustrated as being connected to the system bus 3500 through the controller 2200, the present invention is not limited thereto. For example, the semiconductor memory device 210 may be directly connected to the system bus 3500. In this case, the function of the controller 2200 may be performed by the CPU 3100 and the RAM 3200.

Although the memory system 2000 shown in FIG. 8 is provided as the illustration of FIG. 9, the present invention is not limited thereto. For example, the memory system 2000 may be substituted with the memory system 1000 shown in FIG. 7. According to an exemplary embodiment of the present invention, the computing system 3000 may include both the memory systems 1000 and 2000 described with reference to FIGS. 7 and 8.

According to the exemplary embodiments of the present invention, a semiconductor memory device providing improved reliability and an operating method thereof are provided.

In the drawings and specification, there have been disclosed typical exemplary embodiments of the invention, and although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A semiconductor memory device comprising:
    a memory cell array including a plurality of memory groups each including at least a drain-select transistor and a plurality of memory cells;
    a voltage generator suitable for generating a read voltage that is to be applied to a selected memory cell of the memory cells and a pass voltage that is to be applied to unselected memory cells other than the selected memory cell among the memory cells; and
    a control logic suitable for controlling the voltage generator to generate the pass voltage having different levels depending on a distance between the drain-select transistor and the selected memory cell during a read operation.

2. The semiconductor memory device of claim 1, wherein the control logic controls the voltage generator to generate the pass voltage to become higher as the distance between the drain-select transistor and the selected memory cell becomes larger.

3. The semiconductor memory device of claim 2, wherein the voltage generator generates pass voltages in a number corresponding to the number of main memory cells connected by a bit line.

4. The semiconductor memory device of claim 1, wherein the plurality of memory cells are divided into memory cell groups each having adjacent memory cells, and
    the control logic controls the voltage generator to generate the pass voltage to have different levels depending on a distance between the drain-select transistor and a memory cell group including the selected memory cell during the read operation.

5. The semiconductor memory device of claim 4, wherein the control logic controls the voltage generator to generate the pass voltage having a higher level as the distance between the drain-select transistor and the memory cell group including the selected memory cell becomes larger during the read operation.

6. The semiconductor memory device of claim 5, wherein the voltage generator generates pass voltages in a number corresponding to the number of the memory cell groups.

7. A method of operating a semiconductor memory device including a plurality of memory groups each including at least a drain-select transistor and a plurality of memory cells, the method comprising:
during a read operation, generating a pass voltage having different levels depending on a distance between the drain-select transistor and a selected memory cell of the memory cells; and
applying the pass voltage to unselected memory cells other than the selected memory cell among the memory cells.

8. The method of claim 7, wherein in the generating of the pass voltage, the pass voltage is generated to become higher as the distance between the drain-select transistor and the selected memory cell becomes larger.

9. The method of claim 8, wherein the pass voltages are generated in a number corresponding to the number of main memory cells connected by a bit line.

10. The method of claim 7, wherein the plurality of memory cells are divided into memory cell groups each having adjacent memory cells, and
the pass voltage is generated to have different levels depending on a distance between the drain-select transistor and a memory cell group including the selected memory cell.

11. The method of claim 10, wherein in the generating of the pass voltage, the pass voltage is generated to have a higher level as the distance between the drain-select transistor and the memory cell group including the selected memory cell becomes larger.

12. The method of claim 8, wherein the pass voltages are generated in a number corresponding to the number of the memory cell groups.

13. A semiconductor memory system comprising:
a semiconductor memory device; and
a controller suitable for controlling the semiconductor memory device,
wherein the semiconductor memory device comprises:
a memory cell array including a plurality of memory groups each including at least a drain-select transistor and a plurality of memory cells;
a voltage generator suitable for generating a read voltage that is to be applied to a selected memory cell of the memory cells and a pass voltage that is to be applied to unselected memory cells other than the selected memory cell among the memory cells; and
a control logic suitable for controlling the voltage generator to generate the pass voltage to have different levels depending on a distance between the drain-select transistor and the selected memory cell during a read operation.

14. The semiconductor memory system of claim 13, wherein the control logic controls the voltage generator to generate the pass voltage to become higher as the distance between the drain-select transistor and the selected memory cell becomes larger during the read operation.

* * * * *

UNITED STATES PATENT AND TRADEMARK OFFICE
CERTIFICATE OF CORRECTION

PATENT NO. : 9,147,484 B2  
APPLICATION NO. : 14/200454  
DATED : September 29, 2015  
INVENTOR(S) : Sung Dae Choi Page 1 of 1

It is certified that error appears in the above-identified patent and that said Letters Patent is hereby corrected as shown below:

Title Page

Insert the Foreign Application Priority Data as follows:

-- (30)    Foreign Application Priority Data

Sep. 26, 2013    (KR) ............................... 10-2013-0114775 --

Signed and Sealed this  
Fifth Day of April, 2016

Michelle K. Lee  
*Director of the United States Patent and Trademark Office*